(12) United States Patent
Marsh

(10) Patent No.: US 9,234,279 B2
(45) Date of Patent: Jan. 12, 2016

(54) POROUS ORGANOSILICATE LAYERS, AND VAPOR DEPOSITION SYSTEMS AND METHODS FOR PREPARING SAME

(71) Applicant: Micron Technology, Inc., Boise, ID (US)

(72) Inventor: Eugene P. Marsh, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/471,718

(22) Filed: Aug. 28, 2014

(65) Prior Publication Data

US 2015/0075427 A1    Mar. 19, 2015

Related U.S. Application Data

(60) Division of application No. 13/104,130, filed on May 10, 2011, now Pat. No. 8,840,990, which is a division of application No. 12/200,229, filed on Aug. 28, 2008, now Pat. No. 7,960,291, which is a continuation of application No. 11/217,982, filed on Sep. 1, 2005, now Pat. No. 7,427,570.

(51) Int. Cl.
| | |
|---|---|
| *H01L 21/312* | (2006.01) |
| *B32B 3/26* | (2006.01) |
| *C23C 16/00* | (2006.01) |
| *B05D 3/06* | (2006.01) |
| *C23C 16/448* | (2006.01) |
| *C23C 18/12* | (2006.01) |
| *H01L 21/02* | (2006.01) |
| *H01L 21/316* | (2006.01) |
| *B05D 1/00* | (2006.01) |

(52) U.S. Cl.
CPC .............. *C23C 16/448* (2013.01); *B05D 1/60* (2013.01); *C23C 18/1212* (2013.01); *C23C 18/1254* (2013.01); *C23C 18/1275* (2013.01); *C23C 18/1283* (2013.01); *H01L 21/0228* (2013.01); *H01L 21/02126* (2013.01); *H01L 21/02203* (2013.01); *H01L 21/02216* (2013.01); *H01L 21/31695* (2013.01); *Y10T 428/249953* (2015.04); *Y10T 428/249978* (2015.04); *Y10T 428/249979* (2015.04)

(58) Field of Classification Search
CPC ......................................................... B05D 1/60
See application file for complete search history.

(56) References Cited

U.S. PATENT DOCUMENTS

| | | | |
|---|---|---|---|
| 5,102,643 | A | 4/1992 | Kresge et al. |
| 5,858,457 | A | 1/1999 | Brinker et al. |
| 6,171,945 | B1 | 1/2001 | Mandal et al. |
| 6,482,733 | B2 | 11/2002 | Raaijmakers et al. |
| 6,559,070 | B1 | 5/2003 | Mandal |

(Continued)

OTHER PUBLICATIONS

Landskron et al., "Periodic Mesoporous Organosaticas Containing Interconnected [SI(CH.sub.2)].sub.'Rings," Science, Oct. 10, 2003; 302:266-269.

*Primary Examiner* — Angel Roman
(74) *Attorney, Agent, or Firm* — Wells St. John, P.S.

(57) ABSTRACT

A vapor deposition system includes a deposition chamber having a substrate positioned therein. The system includes at least one vessel containing at least one silsesquioxane precursor. The system includes at least one vessel containing at least one wetting agent or surfactant. The system includes at least one vessel containing a carboxylic acid or nitrogen base. The system includes a source for at least one reaction gas.

11 Claims, 3 Drawing Sheets

(56) References Cited

U.S. PATENT DOCUMENTS

| | | |
|---|---|---|
| 6,573,131 B2 | 6/2003 | Yan et al. |
| 6,630,403 B2 | 10/2003 | Kramer et al. |
| 6,630,696 B2 | 10/2003 | Yan et al. |
| 6,686,271 B2 | 2/2004 | Raaijmakers et al. |
| 6,699,783 B2 | 3/2004 | Raaijmakers et al. |
| 6,866,799 B2 | 3/2005 | Orsbon et al. |
| 6,960,551 B2 | 11/2005 | Ozin et al. |
| 7,112,615 B2 | 9/2006 | Gleason et al. |
| 7,427,570 B2 | 9/2008 | Marsh |
| 2002/0045030 A1 | 4/2002 | Ozin et al. |
| 2004/0028809 A1 | 2/2004 | Bein et al. |
| 2004/0053009 A1 | 3/2004 | Ozin et al. |
| 2004/0096586 A1 | 5/2004 | Schulberg et al. |
| 2004/0105986 A1 | 6/2004 | Ogihara et al. |
| 2004/0180222 A1 | 9/2004 | Ogihara et al. |
| 2004/0188809 A1 | 9/2004 | Ogihara et al. |
| 2004/0201007 A1 | 10/2004 | Yagihashi et al. |
| 2004/0213906 A1 | 10/2004 | Mazany et al. |
| 2005/0037209 A1 | 2/2005 | Tsapatsis et al. |
| 2005/0106802 A1 | 5/2005 | Nishiyama et al. |
| 2005/0189291 A1 | 9/2005 | Sellergren et al. |
| 2006/0093786 A1 | 5/2006 | Ohashi et al. |
| 2010/0216253 A1 | 8/2010 | Shiotsuka et al. |

10 nm

POROUS ORGANOSILICATE LAYERS, AND VAPOR DEPOSITION SYSTEMS AND METHODS FOR PREPARING SAME

RELATED PATENT DATA

This patent resulted from a divisional application of U.S. patent application Ser. No. 13/104,130, filed May 10, 2011, entitled "Porous Organosilicate Layers, and Vapor Deposition Systems and Methods for Preparing Same", naming Eugene P. Marsh as inventor, which resulted from a divisional application of U.S. patent application Ser. No. 12/200,229, filed Aug. 28, 2008, entitled "Porous Organosilicate Layers, and Vapor Deposition Systems and Methods for Preparing Same", naming Eugene P. Marsh as inventor, now U.S. Pat. No. 7,960,291, which resulted from a continuation application of U.S. patent application Ser. No. 11/217,982, filed Sep. 1, 2005, entitled "Porous Organosilicate Layers, and Vapor Deposition Systems and Methods for Preparing Same", naming Eugene P. Marsh as inventor, now U.S. Pat. No. 7,427,570, the disclosures of which are incorporated by reference.

BACKGROUND

Porous inorganic solids have found great utility as catalysts and separations media for industrial applications. The openness of their microstructure allows molecules access to the relatively large surface areas of these materials that enhance their catalytic and sorptive activity.

Amorphous and paracrystalline materials represent an important class of porous inorganic solids that have been used for many years in industrial applications. Typical examples of these materials are the amorphous silicas commonly used in catalyst formulations and the paracrystalline transitional aluminas used as solid acid catalysts and petroleum reforming catalyst supports. The microstructure of the silicas consists of 100-250 Angstrom particles of dense amorphous silica, with the porosity resulting from voids between the particles. Since there is no long range order in these materials, the pores tend be distributed over a rather large range. This lack of order also manifests itself in the X-ray diffraction pattern, which is usually featureless.

Paracrystalline materials, such as certain aluminas, also have a wide distribution of pore sizes, but tend to exhibit better defined X-ray diffraction patterns, usually consisting of a few broad peaks. The microstructure of these materials consists of tiny crystalline regions of condensed alumina phases, with the porosity of the materials resulting from irregular voids between these regions. Since, there is no long range order controlling the sizes of pores in the material, the variability in pore size is typically quite high. The sizes of pores in these materials fall into a regime called the mesoporous range which, for the purposes of this application, is from about 2 to about 50 nanometers (nm).

In sharp contrast to these structurally ill-defined solids are materials whose pore size distribution is very narrow because it is controlled by the precisely repeating crystalline nature of the materials' microstructure. These materials are called "molecular sieves", the most important examples of which are zeolites. Certain zeolitic materials are ordered, porous crystalline aluminosilicates having a definite crystalline structure as determined by X-ray diffraction, within which there are a large number of smaller cavities that may be interconnected by a number of still smaller channels or pores. These cavities and pores are uniform in size within a specific zeolitic material. Since the dimensions of these pores are such as to accept for adsorption molecules of certain dimensions while rejecting those of larger dimensions, these materials are known as "molecular sieves" and are utilized in a variety of ways to take advantage of these properties. The precise crystalline microstructure of most zeolites manifests itself in a well-defined X-ray diffraction pattern that usually contains many sharp maxima that serve to uniquely define the material. Similarly, the dimensions of pores in these materials are very regular, due to the precise repetition of the crystalline microstructure. Molecular sieves typically have pore sizes in the microporous range, which is usually quoted as 0.2 nm to less than 2.0 nm, with a large pore size being about 1.3 nm.

More recently, a new class of porous materials has been discovered and has been the subject of intensive scientific research. This class of new porous materials, referred to as the M41S materials, may be classified as periodic mesoporous materials, which include an inorganic porous crystalline phase material having pores larger than known zeolite pore diameters, for example, diameters of 1.5 to 30 nm. The pore size distribution is generally uniform and the pores are regularly arranged. The pore structure of such mesoporous materials is large enough to absorb large molecules and the pore wall structure can be as thin as about 1 nm. Further, such mesoporous materials are known to have large specific surface areas (e.g., 1000 m$^2$/g) and large pore volumes (e.g., 1 cc/g). For these reasons, such the mesoporous materials enable reactive catalysts, adsorbents composed of a functional organic compound, and other molecules to rapidly diffuse into the pores and therefore, can be advantageous over zeolites, which have smaller pore sizes. Consequently, such mesoporous materials can be useful not only for catalysis of high-speed catalytic reactions, but also as large capacity adsorbents.

The preparation of periodic mesoporous materials typically requires that the film be spun on to the substrate. Spin on processes have disadvantages that include, for example, the physical dimensions of films that can be prepared by the process. Although thin films are desired for certain applications, spin on processes typically result in a film thickness of at least 100 nm. Thus, there remains a need for new methods of preparing periodic mesoporous films.

SUMMARY OF THE INVENTION

In one aspect, the present invention provides a method of forming a film on a substrate (e.g., a semiconductor substrate or substrate assembly). In one embodiment, the method includes: providing a substrate; providing a vapor including at least one silsesquioxane precursor; providing a vapor including at least one wetting agent or surfactant; providing at least one reaction gas (typically water); contacting the vapor including the at least one silsesquioxane precursor, the vapor including the at least one wetting agent or surfactant, and the at least one reaction gas with the substrate to form a condensed phase on at least one surface of the substrate; providing a vapor including a carboxylic acid or a nitrogen base; and contacting the vapor including the carboxylic acid or the nitrogen base with the substrate having the condensed phase thereon to form a film on at least one surface of the substrate.

In another aspect, the present invention provides a method of forming a film on a substrate. The method includes: providing a substrate in a vapor deposition chamber; providing a vapor including at least one silsesquioxane precursor; providing a vapor including at least one wetting agent or surfactant; providing at least one reaction gas (typically water); contacting the vapor including the at least one silsesquioxane precursor, the vapor including the at least one wetting agent or surfactant, and the at least one reaction gas with the substrate to form a condensed phase on at least one surface of the substrate; agitating the substrate; providing a vapor including a carboxylic acid or a nitrogen base; and contacting the vapor including the carboxylic acid or the nitrogen base with the substrate having the agitated condensed phase thereon to form a film on at least one surface of the substrate.

In another aspect, the present invention provides an article including a substrate having a porous organosilicate layer deposited thereon, wherein the porous organosilicate layer has a thickness of at most 100 nanometers prior to removal of any organosilicate material.

In another aspect, the present invention provides a vapor deposition system including: a deposition chamber having a substrate positioned therein; at least one vessel including at least one silsesquioxane precursor; at least one vessel including at least one wetting agent or surfactant; at least one vessel including a carboxylic acid or a nitrogen base; and a source for at least one reaction gas.

DEFINITIONS

As used herein, the term "organic group" is used for the purpose of this invention to mean a hydrocarbon group that is classified as an aliphatic group, cyclic group, or combination of aliphatic and cyclic groups (e.g., alkaryl and aralkyl groups). In the context of the present invention, suitable organic groups for precursors used in this invention are those that do not interfere with the formation of the mesoporous organosilicate using vapor deposition techniques. In the context of the present invention, the term "aliphatic group" means a saturated or unsaturated linear or branched hydrocarbon group. This term is used to encompass alkyl, alkenyl, and alkynyl groups, for example. The term "alkyl group" means a saturated linear or branched monovalent hydrocarbon group including, for example, methyl, ethyl, n-propyl, isopropyl, tert-butyl, amyl, heptyl, and the like. The term "alkenyl group" means an unsaturated, linear or branched monovalent hydrocarbon group with one or more olefinically unsaturated groups (i.e., carbon-carbon double bonds), such as a vinyl group. The term "alkynyl group" means an unsaturated, linear or branched monovalent hydrocarbon group with one or more carbon-carbon triple bonds. The term "cyclic group" means a closed ring hydrocarbon group that is classified as an alicyclic group, aromatic group, or heterocyclic group. The term "alicyclic group" means a cyclic hydrocarbon group having properties resembling those of aliphatic groups. The term "aromatic group" or "aryl group" means a mono- or polynuclear aromatic hydrocarbon group. The term "heterocyclic group" means a closed ring hydrocarbon in which one or more of the atoms in the ring is an element other than carbon (e.g., nitrogen, oxygen, sulfur, etc.).

As a means of simplifying the discussion and the recitation of certain terminology used throughout this application, the terms "group" and "moiety" are used to differentiate between chemical species that allow for substitution or that may be substituted and those that do not so allow for substitution or may not be so substituted. Thus, when the term "group" is used to describe a chemical substituent, the described chemical material includes the unsubstituted group and that group with nonperoxidic O, N, S, Si, or F atoms, for example, in the chain as well as carbonyl groups or other conventional substituents. Where the term "moiety" is used to describe a chemical compound or substituent, only an unsubstituted chemical material is intended to be included. For example, the phrase "alkyl group" is intended to include not only pure open chain saturated hydrocarbon alkyl substituents, such as methyl, ethyl, propyl, tert-butyl, and the like, but also alkyl substituents bearing further substituents known in the art, such as hydroxy, alkoxy, alkylsulfonyl, halogen atoms, cyano, nitro, amino, carboxyl, etc. Thus, "alkyl group" includes ether groups, haloalkyls, nitroalkyls, carboxyalkyls, hydroxyalkyls, sulfoalkyls, etc. On the other hand, the phrase "alkyl moiety" is limited to the inclusion of only pure open chain saturated hydrocarbon alkyl substituents, such as methyl, ethyl, propyl, tert-butyl, and the like.

As used herein, "a," "an," "the," and "at least one" are used interchangeably and mean one or more than one.

As used herein, the term "comprising," which is synonymous with "including" or "containing," is inclusive, open-ended, and does not exclude additional unrecited elements or method steps.

The terms "deposition process" and "vapor deposition process" as used herein refer to a process in which a layer is formed on one or more surfaces of a substrate (e.g., a doped polysilicon wafer) from vaporized precursor composition(s) including one or more silicon-containing compounds. Specifically, one or more silicon-containing compounds are vaporized and directed to and/or contacted with one or more surfaces of a substrate (e.g., semiconductor substrate or substrate assembly), generally placed in a deposition chamber. Typically, the substrate is cooled, and the silicon-containing compound, along with other components, is condensed to give a condensed phase (e.g., a thin, uniform, silicon-containing layer) on the surface(s) of the substrate. Suitable vapor deposition processes include processes similar in nature to "chemical vapor deposition" (CVD).

DETAILED DESCRIPTION OF PREFERRED EMBODIMENTS

Figure 1:
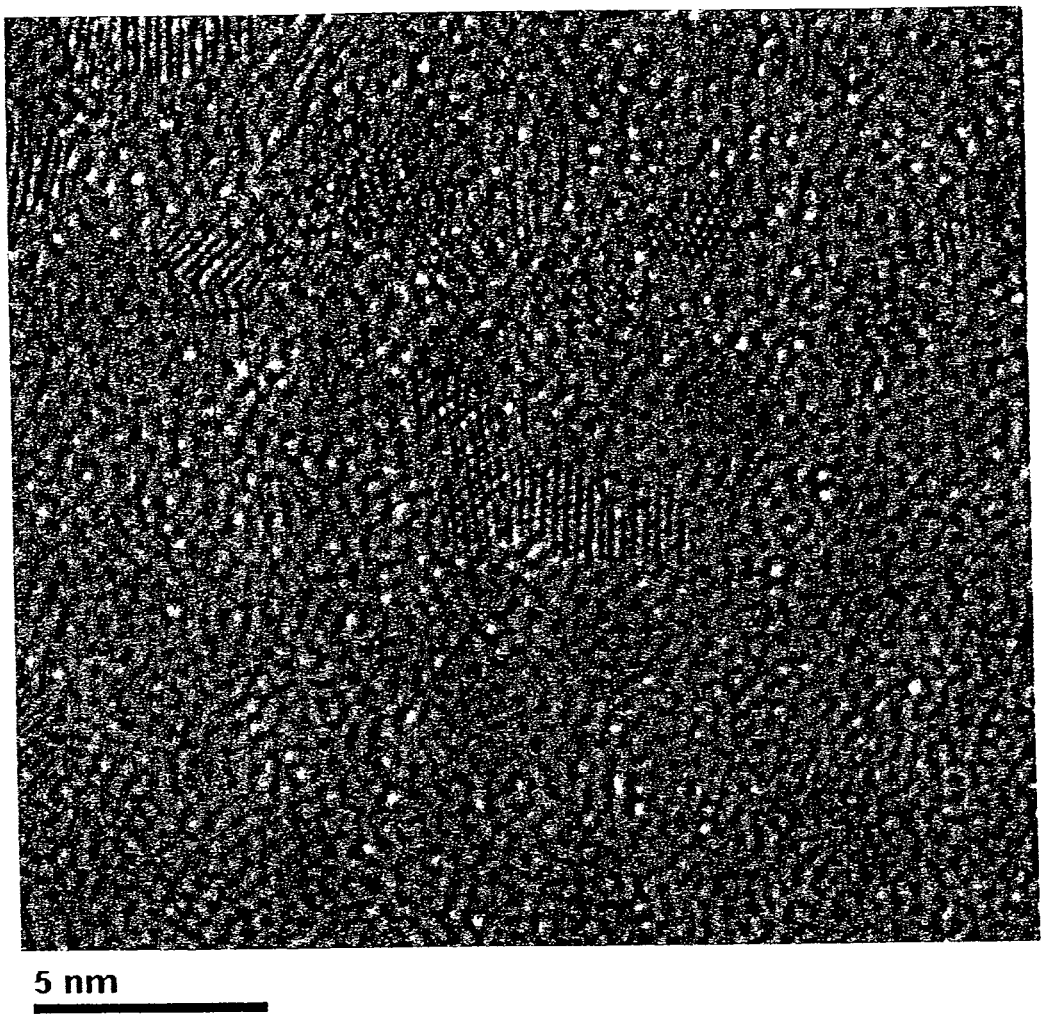
FIG. 1 is a micrograph illustrating local periodicity of a porous organosilicate film as prepared in Example 1.

A periodic mesoporous organosilica containing interconnected $[Si(CH_2)]_3$ rings has been disclosed. See, for example, Ozin et al., *Science*, 302:266-269 (2003). Such mesoporous organosilicates have been shown to self assemble into regular hexagonal arrays with a hole size and pitch that could be useful, for example, as masks for nanocrystal applications, masks for contacts, or containers in dynamic random access memory (DRAM) device applications. However, the disclosed preparation of such periodic mesoporous materials involves spinning the film onto the substrate.

The present invention provides a vapor deposition method for preparing periodic mesoporous organosilicate films. The presently disclosed vapor deposition method can be advantageous over spin on methods, for example, in that thinner films (e.g., less than 100 nm) can be provided. Further, conformal films can preferably be provided on non-planar substrate surfaces.

The method includes providing vapors of components including at least one silsesquioxane precursor; at least one wetting agent or surfactant; and at least one reaction gas (typically water). The vapors are contacted with a substrate to deposit (typically condensed on a cooled wafer, e.g., less than 0° C.) a condensed phase that is allowed to self assemble. The condensed phase may optionally be agitated (e.g., treated with ultrasound) to promote self assembly. Such agitation can take place within the deposition chamber. Alternatively, the substrate with the condensed phase thereon can be transferred to a different chamber under an inert atmosphere for agitation.

A carboxylic acid or nitrogen base can be added concurrently with, and/or subsequent to the self-assembly process. After a sufficient time for self assembly (e.g., typically 2 to 20 hours), the materials are allowed to react and gel, typically by warming (e.g., room temperature or above). The gelled material can then be calcined at the desired temperature (e.g., 130° C. or above) for 2 to 48 hours to form a mesoporous organosilicate film.

Silsesquioxane precursors are silicon containing compounds used in the formation of a silsesquioxane (e.g., a mesoporous organosilicate). As used herein, "silsesquioxanes" are polyhedral frameworks made of Si—O—Si linkages.

In one embodiment, silsesquioxane precursors include compounds of the formula (Formula II) $(R^1O)_3SiR^2Si(OR^1)_3$, wherein each $R^1$ and $R^2$ is independently an organic group, typically a C1 to C10 organic group. Preferably, each $R^1$ is independently a C1 to C4 aliphatic group, and more preferably a C1 to C4 aliphatic moiety. $R^2$ is preferably a C1 to C10 divalent aliphatic moiety, and more preferably a divalent C1 to C4 aliphatic moiety. Formula II can represent a wide variety of silsesquioxane precursors. Exemplary compounds of the formula (Formula II) include, $(CH_3O)_3Si(CH_2)_2Si(OCH_3)_3$, $(CH_3O)_3Si(CH_2)_3Si(OCH_3)_3$, $(CH_3CH_2O)_3Si(CH_2)_2Si(OCH_2CH_3)_3$, $(CH_3CH_2O)_3Si(CH_2)_3Si(OCH_2CH_3)_3$, $(CH_3O)_3Si(CH_2)_2Si(OCH_2CH_3)_3$, $(CH_3O)_3Si(CH_2)_3Si(OCH_2CH_3)_3$, and the like, and combinations thereof.

In another embodiment, silsesquioxane precursors include cyclic compounds of the formula (Formula III) $[(R^1O)_2SiC(R^3)_2]_x$, wherein each $R^1$ is independently an organic group (typically a C1 to C10 organic group), each $R^3$ is independently hydrogen or an organic group (typically a C1 to C10 organic group), and x=3 or 4; and combinations thereof. Preferably, each $R^1$ is independently a C1 to C4 aliphatic group, and more preferably a C1 to C4 aliphatic moiety. Preferably, each $R^3$ is independently hydrogen or a C1 to C4 aliphatic group, more preferably hydrogen or a C1 to C4 aliphatic moiety, and most preferably hydrogen. Formula III can represent a wide variety of silsesquioxane precursors. Exemplary compounds of the formula (Formula III) include, $[(CH_3O)_2SiCH_2]_3$, $[(CH_3CH_2O)_2SiCH_2]_3$, $[(CH_3O)_2SiCH_2]_4$, $[(CH_3CH_2O)_2SiCH_2]_4$, and the like, and combinations thereof.

Further, silsesquioxane precursors can include combinations of compounds of Formula II and compounds of Formula III.

The method also includes a component that is a wetting agent or surfactant. As used herein, "wetting agents" and "surfactants" refer to compounds that assist in the self assembly of the mesoporous organosilicate. Preferably the wetting agent or surfactant has sufficient volatility to be transferred in a vapor deposition process under typical operating conditions. A wide variety of volatile surfactants are known in the art and typically include nonionic surfactants. Exemplary nonionic surfactants include, for example, polyoxyalkylene compounds as disclosed, for example, in U.S. Pat. No. 6,630,403 (Kramer et al.). A wide variety of wetting agents are also known in the art. Exemplary wetting agents include gylcols and ethers as disclosed, for example, in U.S. Pat. No. 6,866,799 (Orsbon et al.) and polyols and alkoxylated alcohols as disclosed, for example, in U.S. Patent Application Publication No. 2004/0213906 A1 (Mazany et al.). Preferably the wetting agent or surfactant includes ethylene glycol or ethylene glycol derivative.

In certain embodiments, the wetting agent or surfactant includes a compound of the formula (Formula I) $RO(CH_2CH_2O)_nR$, wherein each R is independently hydrogen or an organic group (typically a C1 to C10 organic group), and n is from 1 to 10. Preferably, each R is independently a C1 to C4 aliphatic group, and more preferably a C1 to C4 aliphatic moiety. Preferably n is from 1 to 4. Formula I can represent a wide variety of compounds including, for example, ethylene glycol, ethylene glycol monomethyl ether, ethylene glycol dimethyl ether, diethylene glycol, diethylene glycol monomethyl ether, diethylene glycol monobutyl ether, diethylene glycol dimethyl ether, triethylene glycol, triethylene glycol monomethyl ether, triethylene glycol dimethyl ether, tetraethyene glycol, tetraethylene glycol monomethyl ether, tetraethylene glycol dimethyl ether (i.e., tetraglyme), and the like, and combinations thereof.

The method also includes a reaction gas to react with the silsesquioxane precursor in forming the mesoporous organosilicate. Typically, the reaction gas is water, although peroxides could also be used for certain embodiments. In addition to being a reaction gas, water can also serve as a solvent to enhance the mobility of components during the self-assembly process.

The method further includes a component believed to facilitate the reaction between the silsesquioxane precursor and the reaction gas. Such components include, for example, carboxylic acids or nitrogen bases.

Suitable carboxylic acids are typically volatile carboxylic acids. Preferred carboxylic acids are those of the formula $R^4(CO_2H)_x$, wherein $R^4$ is an organic group (typically a C1 to C10 organic group), and x=1 or 2. Preferably $R^4$ is a C1 to C6 aliphatic group, and more preferably a C1 to C6 aliphatic moiety. A wide variety of carboxylic acids can be used including, for example, acetic acid, propionic acid, butyric acid, valeric acid, malonic acid, succinic acid, and combinations thereof.

Suitable nitrogen bases are typically volatile nitrogen bases. Preferred nitrogen bases are those of the formula $R^5R^6R^7N$, wherein each R group is independently hydrogen or an organic group (typically a C1 to C10 organic group), and wherein two or more of $R^5$, $R^6$, and $R^7$ can optionally form one or more rings. Preferably each $R^5$, $R^6$, and $R^7$ is independently hydrogen or a C1 to C6 aliphatic group, and more preferably hydrogen or a C1 to C6 aliphatic moiety. A wide variety of nitrogen bases can be used including, for example, ammonia, methylamine, ethylamine, ethanolamine, dimethylamine, diethylamine, diethanolamine, trimethylamine, triethylamine, triethanolamine, pyrole, pyrrolidine, piperidine, pyridine, morpholine, and combinations thereof.

The amounts of each component can be varied as desired depending on the desired film thickness and properties. Typically, at least a 5:1 molar ratio of water to silsesquioxane precursor is used. Typically, the molar ratio of carboxylic acid or nitrogen base to silsesquioxane precursor is 0.01 to 0.1.

The components can be vapor deposited on a substrate using vapor deposition/condensation methods known in the art. The mesoporous organosilicate layer can be deposited, for example, on a substrate (e.g., a semiconductor substrate or substrate assembly). "Semiconductor substrate" or "substrate assembly" as used herein refer to a semiconductor substrate such as a base semiconductor layer or a semiconductor substrate having one or more layers, structures, or regions formed thereon. A base semiconductor layer is typically the lowest layer of silicon material on a wafer or a silicon layer deposited on another material, such as silicon on sapphire. When reference is made to a substrate assembly, various process steps may have been previously used to form or define regions, junctions, various structures or features, and openings such as transistors, active areas, diffusions, implanted regions, vias, contact openings, high aspect ratio openings, capacitor plates, barriers for capacitors, etc.

"Layer," as used herein, refers to any layer that can be formed on a substrate from one or more precursors and/or reactants according to the deposition process described herein. The term "layer" is meant to include layers specific to the semiconductor industry, such as, but clearly not limited to, a barrier layer, dielectric layer (i.e., a layer having a high dielectric constant), and conductive layer. The term "layer" is synonymous with the term "film" frequently used in the semiconductor industry. The term "layer" is also meant to include layers found in technology outside of semiconductor technology, such as coatings on glass. For example, such layers can be formed directly on fibers, wires, etc., which are substrates other than semiconductor substrates. Further, the layers can be formed directly on the lowest semiconductor surface of the substrate, or they can be formed on any of a variety of layers (e.g., surfaces) as in, for example, a patterned wafer.

Various components can be used in various combinations, optionally with one or more organic solvents, to form a precursor composition. "Precursor" and "precursor composition" as used herein, refer to a composition usable for forming, either alone or with other precursor compositions (or reactants), a layer on a substrate assembly in a deposition process. Further, one skilled in the art will recognize that the type and amount of precursor used will depend on the content of a layer which is ultimately to be formed using a vapor deposition process.

The precursor compositions may be liquids or solids at room temperature (preferably, they are liquids at the vaporization temperature). Typically, they are liquids sufficiently volatile to be employed using known vapor deposition techniques. However, as solids they may also be sufficiently volatile that they can be vaporized or sublimed from the solid state using known vapor deposition techniques. If they are less volatile solids, they are preferably sufficiently soluble in an organic solvent or have melting points below their decomposition temperatures such that they can be used in flash vaporization, bubbling, microdroplet formation techniques, etc. As used herein, "liquid" refers to a solution or a neat liquid (a liquid at room temperature or a solid at room temperature that melts at an elevated temperature). As used herein, "solution" does not require complete solubility of the solid but may allow for some undissolved solid, as long as there is a sufficient amount of the solid delivered by the organic solvent into the vapor phase for chemical vapor deposition processing. If solvent dilution is used in deposition, the total molar concentration of solvent vapor generated may also be considered as a inert carrier gas.

"Inert gas" or "non-reactive gas," as used herein, is any gas that is generally unreactive with the components it comes in contact with. For example, inert gases are typically selected from a group including nitrogen, argon, helium, neon, krypton, xenon, any other non-reactive gas, and mixtures thereof. Such inert gases are generally used in one or more purging processes described according to the present invention, and in some embodiments may also be used to assist in precursor vapor transport.

Solvents that are suitable for certain embodiments of the present invention may be, for example, one or more of the following: halogenated hydrocarbons, silylated hydrocarbons such as alkylsilanes, alkylsilicates, ethers, polyethers, thioethers, esters, lactones, nitriles, silicone oils, or compounds containing combinations of any of the above or mixtures of one or more of the above. The compounds are also generally compatible with each other, so that mixtures of variable quantities of the metal-containing compounds will not interact to significantly change their physical properties.

The components of the present invention can, optionally, be vaporized and deposited substantially simultaneously with one another. Alternatively, the silicon-containing layers may be formed by alternately introducing one or more components during each deposition cycle.

Suitable substrate materials of the present invention include conductive materials, semiconductive materials, conductive metal-nitrides, conductive metals, conductive metal oxides, etc. The substrate on which the silicon-containing layer is formed is preferably a semiconductor substrate or substrate assembly. A wide variety of semiconductor materials are contemplated, such as for example, borophosphosilicate glass (BPSG), silicon such as, e.g., conductively doped polysilicon, monocrystalline silicon, etc. (for this invention, appropriate forms of silicon are simply referred to as "silicon"), for example in the form of a silicon wafer, tetraethylorthosilicate (TEOS) oxide, spin on glass (i.e., a thin layer of $SiO_2$, optionally doped, deposited by a spin on process), TiN, TaN, W, Ru, Al, Cu, noble metals, etc. A substrate assembly may also contain a layer that includes platinum, iridium, iridium oxide, rhodium, ruthenium, ruthenium oxide, strontium ruthenate, lanthanum nickelate, titanium nitride, tantalum nitride, tantalum-silicon-nitride, silicon dioxide, aluminum, gallium arsenide, glass, etc., and other existing or to-be-developed materials used in semiconductor constructions, such as dynamic random access memory (DRAM) devices, static random access memory (SRAM) devices, and ferroelectric memory (FERAM) devices, for example.

For substrates including semiconductor substrates or substrate assemblies, the layers can be formed directly on the lowest semiconductor surface of the substrate, or they can be formed on any of a variety of the layers (i.e., surfaces) as in a patterned wafer, for example.

Substrates other than semiconductor substrates or substrate assemblies can also be used in methods of the present invention. Any substrate that may advantageously form a metal-containing layer thereon, such as a metal oxide layer, may be used, such substrates including, for example, fibers, wires, etc.

A preferred deposition process for the present invention is a vapor deposition/condensation process. Vapor deposition processes are generally favored in the semiconductor industry due to the process capability to quickly provide highly conformal layers even within deep contacts and other openings.

The precursor compositions can be vaporized in the presence of an inert carrier gas if desired. Additionally, an inert carrier gas can be used in purging steps in certain process. The inert carrier gas is typically one or more of nitrogen, helium, argon, etc. In the context of the present invention, an inert carrier gas is one that does not interfere with the formation of the silicon-containing layer. Whether done in the presence of a inert carrier gas or not, the vaporization is preferably done in the absence of oxygen to avoid oxygen contamination of the layer (e.g., oxidation of silicon to form silicon dioxide or oxidation of precursor in the vapor phase prior to entry into the deposition chamber).

Suitable vapor deposition processes can be employed to form thin, continuous, uniform, silicon-containing layers onto semiconductor substrates. Typically one or more components are vaporized in a deposition chamber and directed to and/or contacted with the substrate to form a silicon-containing layer on the substrate. It will be readily apparent to one skilled in the art that the vapor deposition process may be enhanced by employing various related techniques such as plasma assistance, photo assistance, laser assistance, as well as other techniques.

A typical vapor deposition process may be carried out in a chemical vapor deposition reactor, such as a deposition chamber available under the trade designation of 7000 from Genus, Inc. (Sunnyvale, Calif.), a deposition chamber available under the trade designation of 5000 from Applied Materials, Inc. (Santa Clara, Calif.), or a deposition chamber available under the trade designation of Prism from Novelus, Inc. (San Jose, Calif.). However, any deposition chamber suitable for performing vapor deposition may be used.

Several modifications of the CVD chambers are possible, for example, using atmospheric pressure chemical vapor deposition, low pressure chemical vapor deposition (LPCVD), plasma enhanced chemical vapor deposition (PECVD), hot wall or cold wall reactors or any other chemical vapor deposition technique. Furthermore, pulsed CVD can be used, which is similar to ALD but does not rigorously avoid intermixing of precursor and reactant gas streams.

Preferred thicknesses of the mesoporous organosilcate layers of the present invention are at least 1 angstrom (Å), more preferably at least 5 Å, and more preferably at least 10 Å. Additionally, preferred film thicknesses are typically no greater than 100 nm, more preferably no greater than 50 nm, and more preferably no greater than 20 nm.

When components are introduced by pulsing, the pulse duration of precursor composition(s) and inert carrier gas(es) is generally of a duration sufficient to saturate the substrate surface. Typically, the pulse duration is at least 0.1, preferably at least 0.2 second, and more preferably at least 0.5 second. Preferred pulse durations are generally no greater than 5 seconds, and preferably no greater than 30 seconds.

For a typical vapor deposition process, the pressure inside the deposition chamber is at least $10^{-8}$ torr ($1.3 \times 10^{-6}$ Pa), preferably at least $10^{-7}$ torr ($1.3 \therefore 10^{-5}$ Pa), and more preferably at least $10^{-6}$ torr ($1.3 \times 10^{-4}$ Pa). Further, deposition pressures are typically no greater than 10 torr ($1.3 \times 10^3$ Pa), preferably no greater than 1 torr ($1.3 \times 10^2$ Pa), and more preferably no greater than $10^{-1}$ torr (13 Pa). Typically, the deposition chamber is purged with an inert carrier gas after the vaporized precursor composition(s) have been introduced into the chamber and/or reacted for each cycle. The inert carrier gas/gases can also be introduced with the vaporized precursor composition(s) during each cycle.

The calcining (or annealing) operation is preferably performed for a time period of at least 0.5 minute, more preferably for a time period of at least 1 minute. Additionally, the annealing operation is preferably performed for a time period of no greater than 48 hours, and more preferably for a time period of no greater than 24 hours.

One skilled in the art will recognize that such temperatures and time periods may vary. For example, furnace anneals and rapid thermal annealing may be used, and further, such anneals may be performed in one or more annealing steps.

As stated above, porous organosilicate films, and especially mesoporous organosilicate films and periodic mesoporous organosilicate films, can be used in semiconductor processes as, for example, etch masks and/or deposition masks. Such porous organosilicate films can also be used to generate nanocrystals, contacts, or containers (e.g., deep holes as cylindrical containers).

Figure 3:
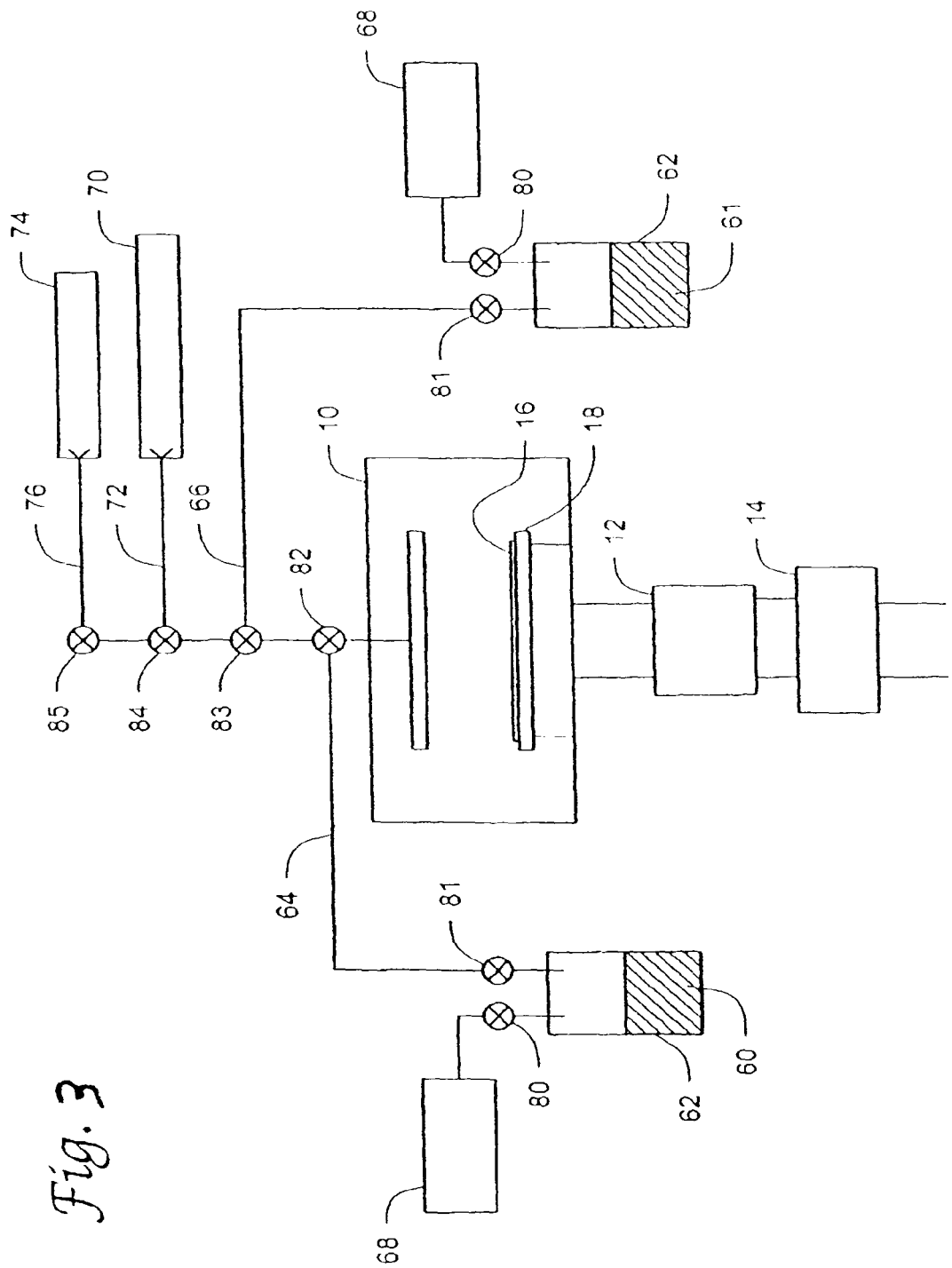
FIG. 3 is a perspective view of a vapor deposition system suitable for use in methods of the present invention.

A system that can be used to perform vapor deposition processes of the present invention is shown in FIG. 3. The system includes an enclosed vapor deposition chamber 10, in which a vacuum may be created using turbo pump 12 and backing pump 14. One or more substrates 16 (e.g., semiconductor substrates or substrate assemblies) are positioned in chamber 10. A constant nominal temperature is established for substrate 16, which can vary depending on the process used. Substrate 16 may be cooled, for example, to temperatures as low as −100° C. or lower by activating cooling loop 19. Cooling loop 19 can employ conventional coolants known in the art (e.g., fluorocarbon coolants in a closed cycle refrigerator, liquid nitrogen, and the like). Substrate 16 may also be heated, for example, by an electrical resistance heater 18 on which substrate 16 is mounted. Other known methods of heating the substrate may also be utilized.

In this process, precursor compositions as described herein, 60 and/or 61, are stored in vessels 62. The precursor composition(s) are vaporized and separately fed along lines 64 and 66 to the deposition chamber 10 using, for example, an inert carrier gas 68. A reaction gas 70 may be supplied along line 72 as needed. Also, a purge gas 74, which is often the same as the inert carrier gas 68, may be supplied along line 76 as needed. As shown, a series of valves 80-85 are opened and closed as required.

The following examples are offered to further illustrate various specific embodiments and techniques of the present invention. It should be understood, however, that many variations and modifications understood by those of ordinary skill in the art may be made while remaining within the scope of the present invention. Therefore, the scope of the invention is not intended to be limited by the following example. Unless specified otherwise, all percentages shown in the examples are percentages by weight.

EXAMPLES

Example 1

Figure 2:
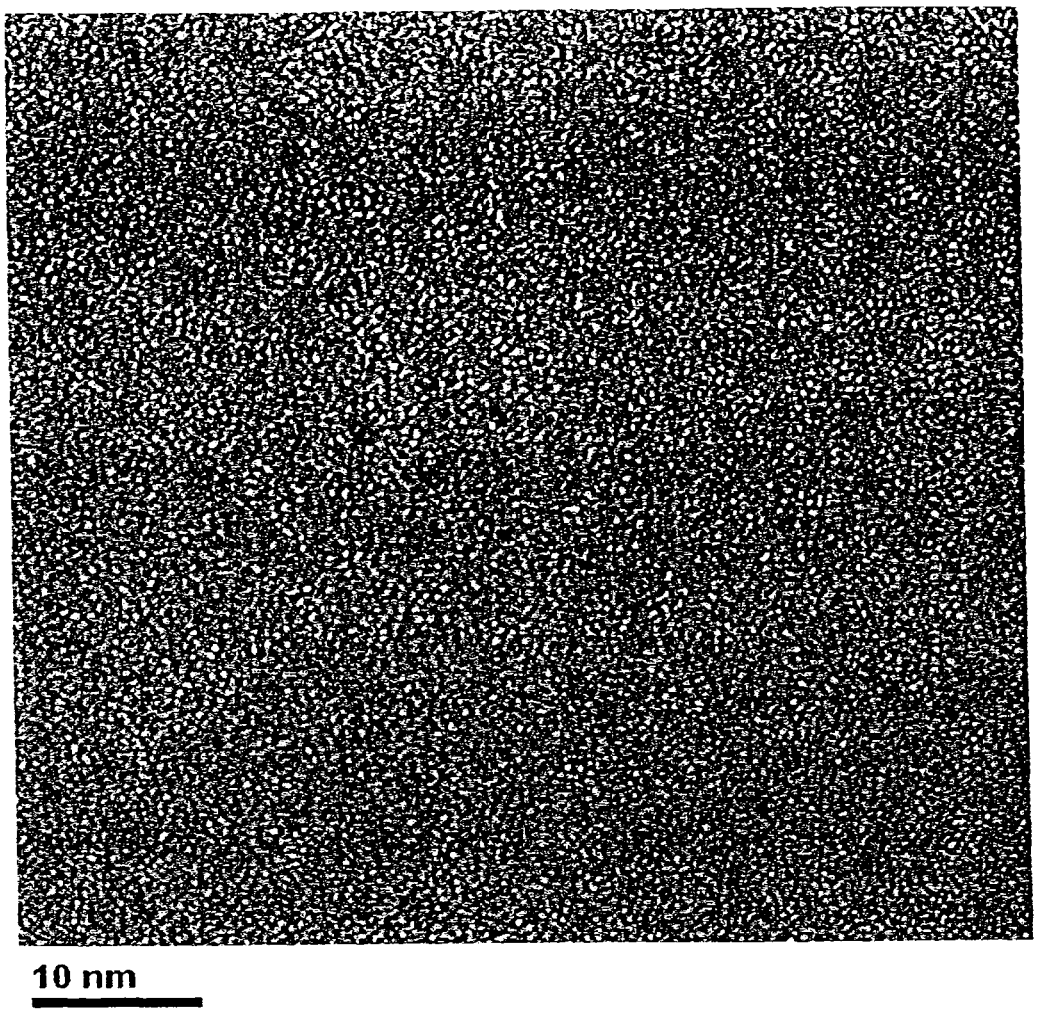
FIG. 2 is a lower magnification micrograph illustrating larger scale periodicity of a porous organosilicate film as prepared in Example 1.

Vapor Deposition of a Silsesquioxane Precursor Compound of Formula III ($R^1$=ethyl; $R^3$=hydrogen; and x=3) to Form a Porous Organosilicate Layer A layer was deposited on a bare silicon wafer as follows. Tris(diethoxysila)cyclohexane was condensed at −40° C. on a cryogenically cooled wafer (approximately −20° C. to −40° C.) at a pressure of $4 \times 10^{-6}$ torr using a 2 second pulse. Water was used as a reaction gas and/or solvent, and was pulsed in from a fixed volume saturated with room temperature water vapor to result in a pressure of $1.3 \times 10^{-5}$ torr Tetraglyme at 70° C. was pulsed in for 1 second. The cycle was then repeated an additional number of times to yield the desired thickness of the film. The wafer was moved from the chamber to another wafer stage at approximately 5° C. in an inert atmosphere, and subjected to ultrasonic agitation to promote self-assembly in the film. The wafer was then returned to the deposition chamber at atmospheric pressure under an inert atmosphere and allowed to cool and freeze at −40° C. The pressure in the chamber was then reduced to $4 \times 10^{-6}$ torr. Glacial acetic acid was pulsed in from a fixed volume to result in a pressure of $7 \times 10^{-5}$ torr. The wafer was then warmed to room temperature under nitrogen at atmospheric pressure to allow the film to gel. The wafer was then calcined at 200° C. for 1 hour. Transmission electron microscopy (TEM) on the resulting film resulted in the micrographs illustrated in FIGS. 1 and 2, which illustrate self-assembly of the film. FIG. 1 is a micrograph illustrating local periodicity (e.g., in approximately a 3 micrometer range) of the film. FIG. 2 is a lower magnification micrograph illustrating periodicity or self-assembly on a larger scale.

The complete disclosures of the patents, patent documents, and publications cited herein are incorporated by reference in their entirety as if each were individually incorporated. Various modifications and alterations to this invention will become apparent to those skilled in the art without departing from the scope and spirit of this invention. It should be understood that this invention is not intended to be unduly limited by the illustrative embodiments and examples set forth herein and that such examples and embodiments are presented by way of example only with the scope of the invention intended to be limited only by the claims set forth herein as follows.

What is claimed is:

1. A vapor deposition system comprising:
   a deposition chamber having a substrate positioned therein;
   at least one vessel comprising at least one silsesquioxane precursor;
   at least one vessel comprising at least one wetting agent or surfactant;
   at least one vessel comprising a carboxylic acid or nitrogen base; and
   a source for at least one reaction gas.

2. The system of claim 1 wherein the silsesquioxane precursor is selected from the group consisting of compounds of the formula (Formula II) $(R^1O)_3SiR^2Si(OR^1)_3$, wherein each $R^1$ and $R^2$ is independently an organic group; cyclic compounds of the formula (Formula III) $[(R^1O)_2SiC(R^3)_2]_x$, wherein each $R^1$ is independently an organic group, each $R^3$ is independently hydrogen or an organic group, and x=3 or 4; and combinations thereof.

3. The system of claim 2 wherein each $R^1$ and $R^2$ is independently an organic group having 1 to 10 carbon atoms.

4. The system of claim 2 wherein each $R^3$ is independently hydrogen or an organic group having 1 to 10 carbon atoms.

5. The system of claim 1 wherein the at least one wetting agent or surfactant comprises a compound of the formula (Formula I) $RO(CH_2CH_2O)_nR$, wherein each R is independently hydrogen or an organic group, an n is from 1 to 10.

6. The system of claim 1 wherein the carboxylic acid is a volatile carboxylic acid of the formula $R^4(CO_2H)_x$, wherein $R^4$ is an organic group and x=1 or 2.

7. The system of claim 6 wherein $R^4$ is an organic group having 1 to 10 carbon atoms.

8. The system of claim 7 wherein the carboxylic acid is selected from the group consisting of acetic acid, propionic acid, butyric acid, valeric acid, malonic acid, succinic acid, and combinations thereof.

9. The system of claim 1 wherein the nitrogen base is a volatile nitrogen base of the formula $R^5R^6R^7N$, wherein each R group is independently hydrogen or an organic group, and wherein two or more of $R^5$, $R^6$, and $R^7$ can optionally form one or more rings.

10. The system of claim 9 wherein each R group is independently hydrogen or an organic group having 1 to 10 carbon atoms.

11. The system of claim 9 wherein the nitrogen base is selected from the group consisting of ammonia, methylamine, ethylamine, ethanolamine, dimethylamine, diethylamine, diethanolamine, trimethylamine, triethylamine, triethanolamine, pyrole, pyrrolidine, piperidine, pyridine, morpholine, and combinations thereof.

* * * * *